United States Patent
Lee (10) Patent No.: US 7,184,362 B2
(45) Date of Patent: Feb. 27, 2007

(54) PAGE ACCESS CIRCUIT OF SEMICONDUCTOR MEMORY DEVICE

(75) Inventor: Yin Jae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 70 days.

(21) Appl. No.: 11/149,346

(22) Filed: Jun. 10, 2005

(65) Prior Publication Data

US 2006/0262617 A1    Nov. 23, 2006

(30) Foreign Application Priority Data

May 18, 2005   (KR) .................... 10-2005-0041610

(51) Int. Cl.
*G11C 8/00* (2006.01)
(52) U.S. Cl. ..................... 365/235; 365/203
(58) Field of Classification Search ................ 365/235, 365/203

See application file for complete search history.

(56) References Cited

U.S. PATENT DOCUMENTS

| | | | |
|---|---|---|---|
| 5,327,395 A | 7/1994 | Sugiura et al. | |
| 5,335,336 A | 8/1994 | Kametani | |
| 5,694,370 A | 12/1997 | Yoon | |
| 5,715,421 A | 2/1998 | Akiyama et al. | |
| 5,940,404 A | 8/1999 | Delp et al. | |
| 6,115,323 A | 9/2000 | Hashimoto | |
| 2004/0015663 A1 | 1/2004 | Choi | |
| 2005/0018529 A1* | 1/2005 | Takatsuka et al. | 365/233.5 |
| 2005/0057995 A1* | 3/2005 | Mitani et al. | 365/222 |
| 2005/0073895 A1* | 4/2005 | Yahata et al. | 365/222 |

FOREIGN PATENT DOCUMENTS

| | | |
|---|---|---|
| JP | 09-219008 | 8/1997 |
| JP | 11-144451 | 5/1999 |
| JP | 2002-312235 | 10/2002 |

* cited by examiner

*Primary Examiner*—Michael Tran
(74) *Attorney, Agent, or Firm*—Heller Ehrman LLP (57) ABSTRACT

A page access circuit of a semiconductor memory device is normally operated even when a page address toggles at any timing in a page mode. The page access circuit comprises an address buffer, a column control unit, a page control unit, a pre-active unit and a precharge unit. The column control unit is controlled by the page address control signal. The page control unit controlled by a sense detecting signal is adapted and configured to generate the page address control signal. The pre-active unit controlled by the page address control signal is adapted and configured to generate a mode identification signal in response to the page address transition detecting signal. The precharge unit is adapted and configured to perform a selective precharge operation in response to the mode identification signal.

11 Claims, 8 Drawing Sheets

PAGE ACCESS CIRCUIT OF SEMICONDUCTOR MEMORY DEVICE

BACKGROUND OF THE INVENTION

1. Field of the Invention

The present invention generally relates to an active control circuit of a Pseudo Static Random Access Memory (hereinafter, referred to as "PSRAM"), and more specifically, to a technology of enabling a normal operation even when a page address toggles at any timing in a page operation.

2. Description of the Related Art

In general, a Dynamic Random Access Memory (hereinafter, referred to as "DRAM") memorizes information as a type of charges in a capacitor, shares the charges in a corresponding bit line through a transistor, and amplify the shared charges in a sense amplifier to read data.

The above-described DRAM which comprises a transistor and a capacitor embodies a memory having a large memory capacity with a small area.

Meanwhile, elements of a memory device become miniaturized for the purpose of high-speed operation of memory devices, reduction of current consumption and miniaturization of processing systems.

As a result of miniaturization of devices, the area of the memory cell capacitor becomes smaller, so that the capacity of the memory cell capacitor is reduced.

If the value of the capacity of the memory cell capacitor becomes smaller, the amount of retained charges is reduced even when the same voltage level of data is written in the capacitor.

In order to compensate the decrease in the amount of retained charges, a refresh operation is periodically performed. Here, the refresh operation is amplified by a sense amplifier after the data stored in the memory cell capacitor is read in a bit line, and then the amplified data is rewritten in the original memory cell capacitor.

When a data retaining characteristic is degraded in a miniaturized device, a refresh cycle is required to be short in order to compensate the degradation of the data retaining characteristic. However, when the refresh cycle becomes short, an external processing device is inaccessible to the DRAM, so that the performance of the processing system is degraded.

Additionally, when the refresh cycle becomes short, current consumption for the refresh operation is increased. Specifically, the short refresh cycle does not satisfy a low standby current condition required in a data retaining mode of a portable battery driving device that requires low current consumption.

In order to solve the problem of the refresh operation in the DRAM, a PSRAM has been known which is a DRAM operated like a SRAM (Static Random Access Memory).

In the PSRAM, a cycle for performing read/write operations on common data and a refresh cycle for performing a refresh operation on data are successively performed for one cycle in a memory access cycle. Since the refresh operation is performed in one access cycle, the refresh operation can be hidden on the external access to operate a DRAM as a SRAM.

In a row path of a general memory device, a row address is inputted to select a word line corresponding to a row address from a plurality of word lines. Then, data stored in a memory cell connected to the selected word line are transmitted by charge sharing to a bit line, and a bit line sense amplifier senses a micro-data signal on a bit line to amplify the signal to a level having a full swing width.

In a column path of a memory device, a column address is inputted to select a memory cell corresponding to a column address from a plurality of memory cells connected to a specific word line selected by a row address, thereby outputting data on a bit line to the outside.

Generally, it takes more time in the row path than in the column path because the row path is longer than the column path.

A page mode has been introduced to perform the more effective read or write operation in the memory device. Here, a page means a memory cell that shares the same word line and has a different column address.

As a result, both of a row path and a column path are not performed whenever data are stored or read in a memory cell. A row path is once performed at an initial stage, and only a column path is changed by changing a column address while a word line is activated, so that a read/write operation is operated at a high speed.

Figure 1:
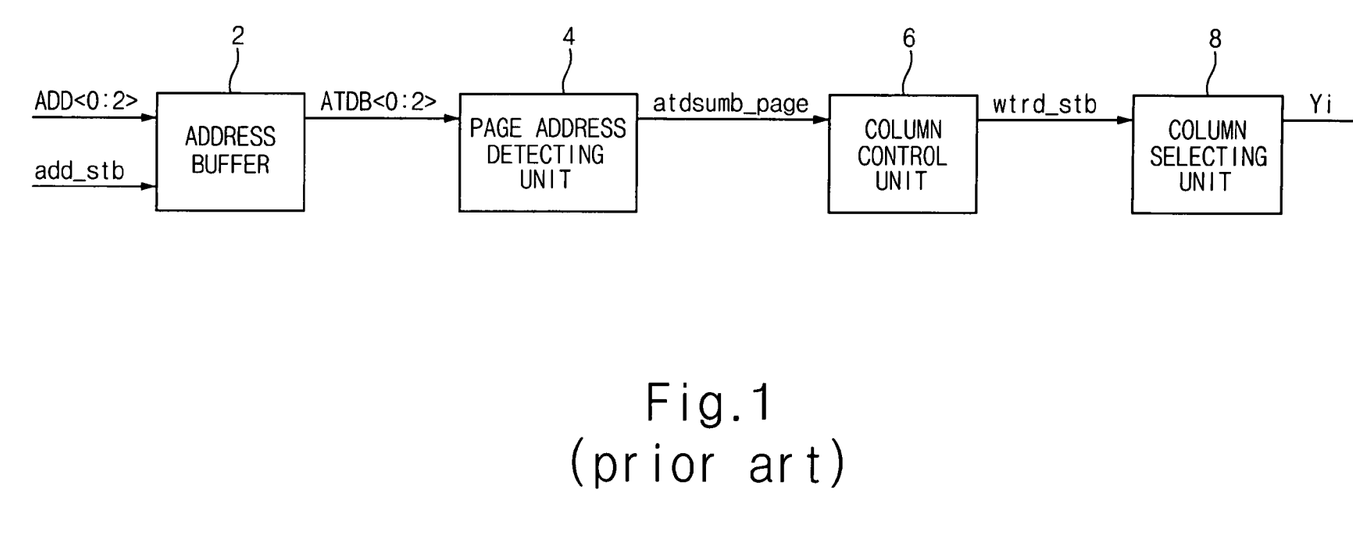
FIG. 1 is a block diagram illustrating a page access control circuit of a conventional PSRAM.

FIG. 1 is a block diagram illustrating a page access control circuit of a conventional PSRAM.

The conventional page access control circuit comprises an address buffer 2, a page address detecting unit 4, a column control unit 6 and a column selecting unit 8.

The address buffer 2 receives a page address ADD<0:2> from an external address pin, and detects an address transition timing in response to an address strobe signal add_stb to generate a page address transition detecting signal ATDB21 0:2>.

The page address detecting unit 4 generates a page address detecting signal atdsumb_page which detects when a page address toggles in response to the address transition detecting signal ATDB<0:2>.

The column control unit 6 receives the page address detecting signal atdsumb_page to generate a write/read operation strobe signal wtdr_stb.

The column selecting unit 8 generates a column selecting signal Yi in response to the write/read operation strobe signal wtdr_stb.

Figure 2:
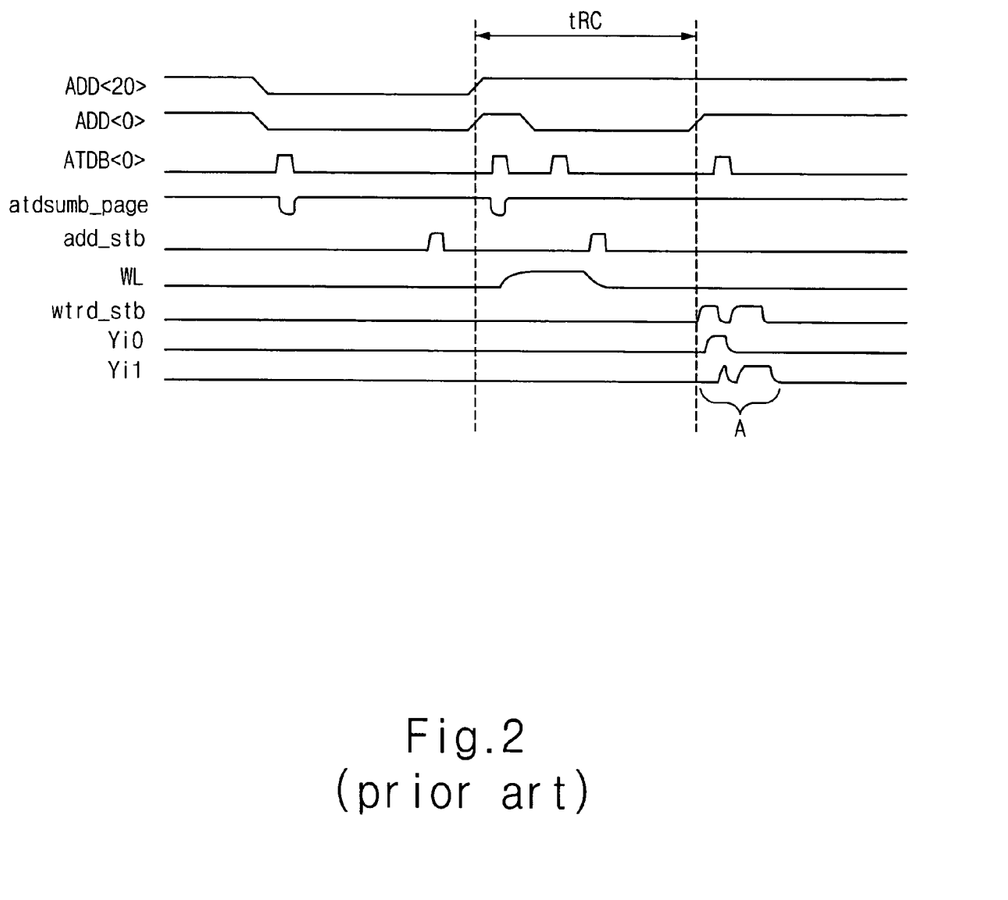
FIG. 2 is a timing diagram illustrating the operation of the page access control circuit of the conventional PSRAM of FIG. 1.

FIG. 2 is a timing diagram illustrating the operation of the page access control circuit of the conventional PSRAM of FIG. 1. Here, FIG. 2 shows a simulation diagram when the column selecting signal Yi is double enabled (A).

In the PSRAM whose page operation is performed asynchronously, a normal address ADD<20> for enabling a word line WL toggles first, and then a page address ADD<0> toggles after a time of tRC (generally, 70~85 ns).

If the normal address ADDM<20> for enabling the word line WL toggles and the page address ADD<0> toggles before the tRC so that the page address ADD<0> meats a high level period of the write/read operation strobe signal wtdr_stb, the column selecting signal Yi is double enabled like the period A of FIG. 2.

In other words, if the normal address ADD<20> for enabling the word line WL toggles and the page address ADD<0> toggles before tRC, the toggle of the page address ADD<0> is regarded as an error. As a result, the toggle is ignored or two or more page addresses are accessed, so that two or more columns are selected to destroy data or cause mis-operations.

SUMMARY OF THE INVENTION

Various embodiments of the present invention are directed at enabling a normal operation even when a page address toggles at any timing in a PSRAM that performs a page operation.

According to one embodiment of the present invention, a page access control circuit of a semiconductor memory device comprises an address transition detecting unit adapted and configured to generate a page address transition detecting signal, a column control unit controlled by a page address control signal, a column selecting unit adapted and configured to generate a column selecting signal in response to the write/read operation strobe signal, a page control unit controlled by a sense detecting signal which represents completion of an operation of a bit line sense amplifier, a pre-active unit, and a precharge unit controlled by the page address active precharge identification signal. The column control unit is adapted and configured to generate a write/read operation strobe signal in response to the page address transition detecting signal. The page control unit is adapted and configured to generates the page address control signal in response to a refresh signal and a read command signal. The pre-active unit is adapted and configured to generate a normal mode control signal which represents that there is a new external access, and to generate a page address active precharge identification signal in response to the page address control signal and the page address transition detecting signal. The precharge unit is adapted and configured to perform a selective precharge operation.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 3:
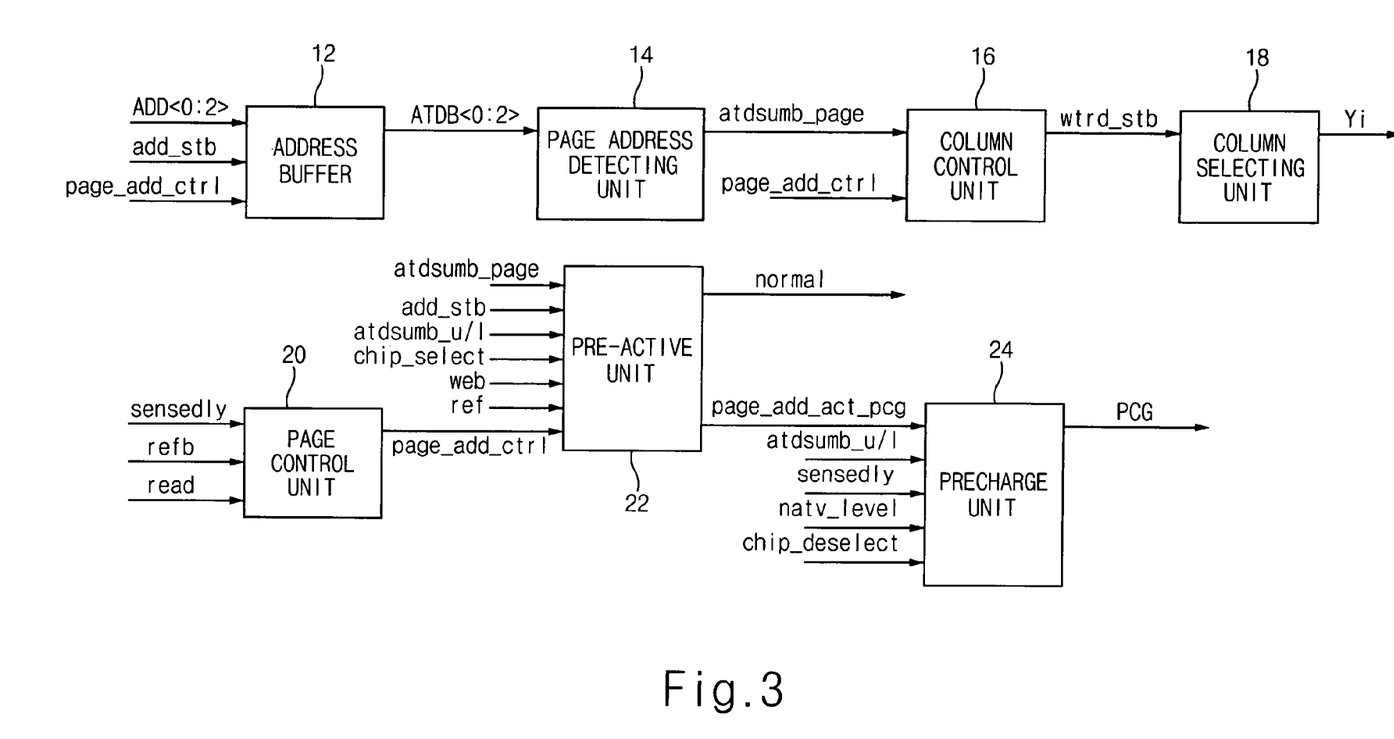
FIG. 3 is a block diagram illustrating a page access control circuit of a PSRAM according to an embodiment of the present invention.

FIG. 3 is a block diagram illustrating a page access control circuit of a PSRAM according to an embodiment of the present invention.

In this embodiment, a page access control circuit comprises an address buffer 12, a page address detecting unit 14, a column control unit 16, a column selecting unit 18, a page control unit 20, a pre-active unit 22 and a precharge unit 24.

The address buffer 12 receives a page address ADD<0:2> from an external address pin to detect a transition timing of the page address ADD<0:2> in response to an address strobe signal add_stb and a page address control signal page_add_ctrl, thereby generating address transition detecting signals ATDB<0:2>.

The page address detecting unit 14 generates a page address detecting signal atdsumb_page in response to the address transition detecting signals ATDB<0:2>.

The column control unit 16 receives the page address detecting signal atdsumb_page to generate a write/read operation strobe signal wtdr_stb in response to a page address control signal page_add_ctrl.

The column selecting unit 18 generates a column selecting signal Yi in response to the write/read operation strobe signal wtdr_stb.

The page control unit 20 generates a page address control signal page_add_ctrl in response to a read command signal read, a refresh signal refb and a sense detecting signal sensedly which represents completion of an operation of a bit line sense amplifier.

The pre-active unit 22 is controlled by normal address transition signals atdsumb_u and atdsumb_l generated when a normal address toggles, a chip selecting signal chip_select, a refresh signal refb, a write enable signal web, the page address detecting signal atdsumb_page and the page address control signal page_add_ctrl and generates a normal mode control signal normal in response to the address strobe signal add_stb and a page address active precharge identification signal page_add_act_pcg in response to the page address detecting signal atdsumb_page and the page address control signal page_add_ctrl. Here, the normal mode control signal normal is a signal to notify that there is a new external access.

The precharge unit 24 generates a precharge signal pcg in response to a chip non-selection signal chip_deselect and a normal active level signal natv_level which becomes 'low' when a pulse of the precharge signal pcg is generated. The precharge signal pcg becomes 'high' when the normal address transition signals atdsumb_u and atdsub_l, the sense detecting signal sensedly and an external active signal extatv become at a high pulse.

Figure 4:
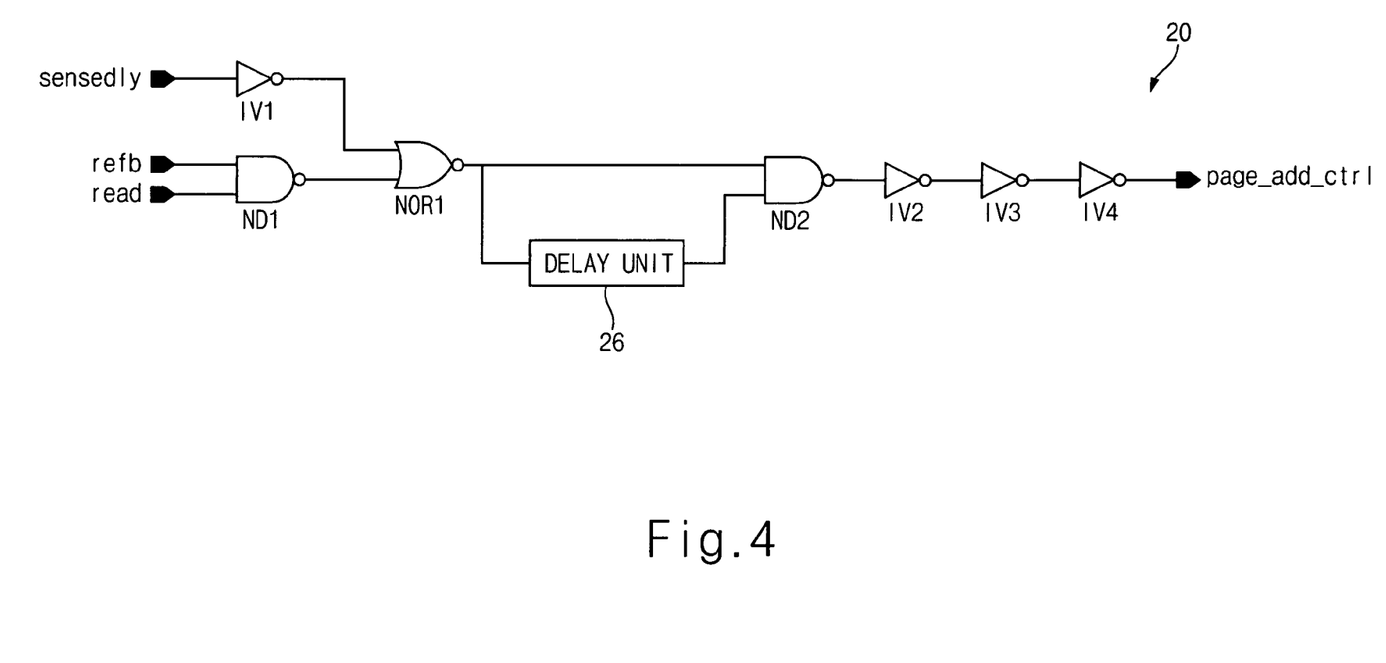
FIG. 4 is a circuit diagram illustrating a page control unit of FIG. 3.

FIG. 4 is a circuit diagram illustrating the page control unit 20 of FIG. 3.

The page control unit 20 comprises inverters IV1~IV4, NAND gates ND1 and ND2, a NOR gate NOR1 and a delay unit 26.

The inverter IV1 inverts the sense detecting signal sensedly, and the NAND gate ND1 performs a NAND operation on the refresh signal refb and the read command signal read.

The NOR gate NOR1 performs a NOR operation on output signals from the inverter IV1 and the NAND gate ND1.

The delay unit 26 delays an output signal from the NOR gate NOR1 for a predetermined time, and the NAND gate ND2 performs a NAND operation on output signals from the NOR gate NOR1 and the delay unit 26.

The inverters IV2~IV4 sequentially invert an output signal from the NAND gate ND2 to generate the page address control signal page_add_ctrl.

Figure 5:
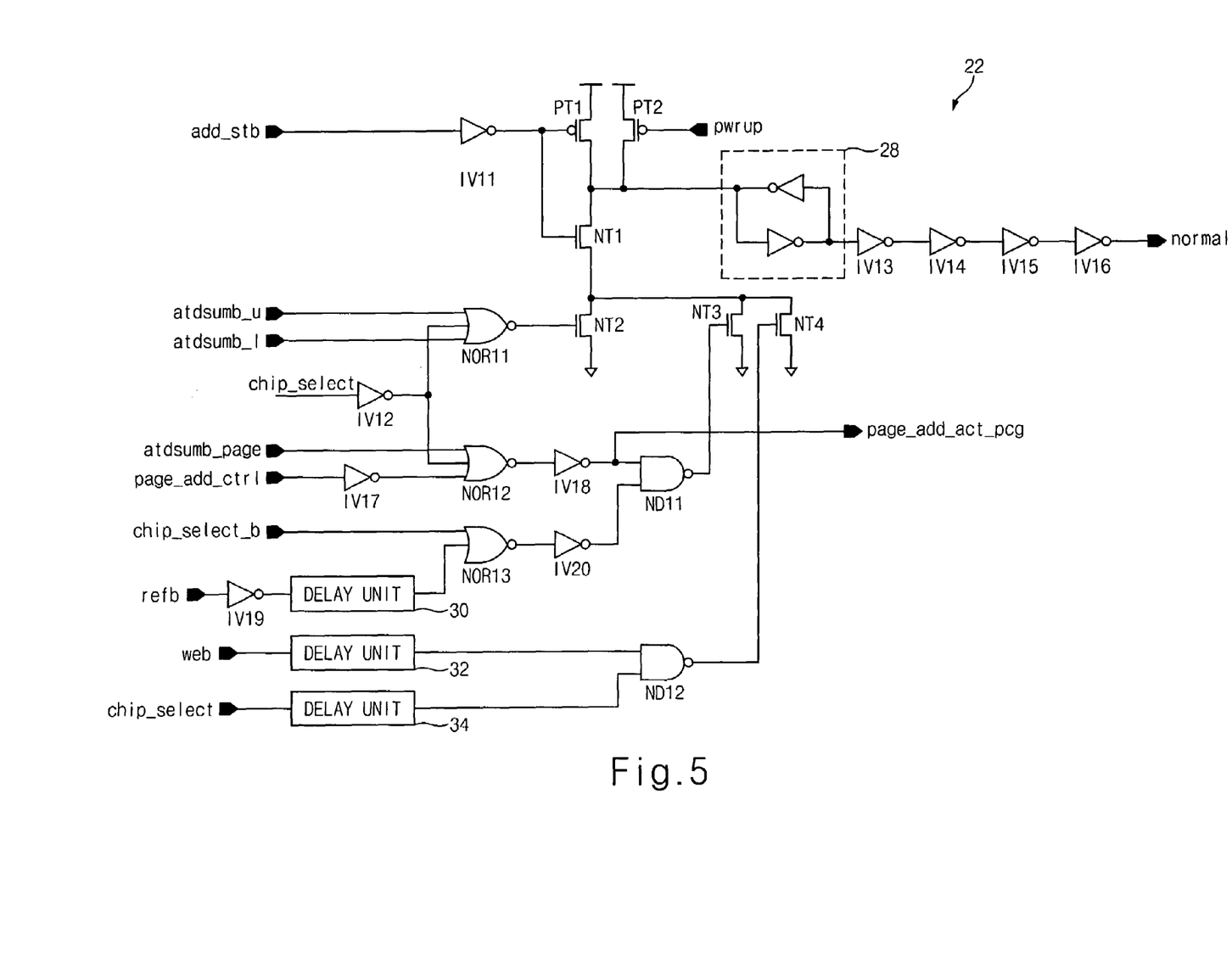
FIG. 5 is a circuit diagram illustrating a pre-active unit of FIG. 3.

FIG. 5 is a circuit diagram illustrating the pre-active unit 22 of FIG. 3.

The pre-active unit 22 comprises inverters IV11~IV20, NOR gates NOR11~NOR13, NAND gates ND11~ND12, PMOS transistors PT1~PT2, NMOS transistors NT1~NT4, a latch unit 28, and delay units 30, 32 and 34.

The inverter IV11 inverts the address strobe signal add_stb, and the inverter IV12 inverts the chip selecting signal chip_select.

The NOR gate NOR11 performs a NOR operation on an output signal from the inverter IV12 and the normal address transition detecting signals atdsumb_u and atdsumb_l.

The PMOS transistor PT1 and the NMOS transistor NT1 pull up or pull down a common drain n1 in response to an output signal from the inverter IV11.

The latch unit 28 maintains a potential of the node n1, and the inverters IV13~IV16 sequentially invert a potential latched in the latch unit 28 to generate the normal mode signal normal.

The PMOS transistor PT2 is controlled by a power-up signal pwrup, and precharges the node n1 to a power voltage.

The NMOS transistor NT2 is controlled by an output signal from the NOR gate NOR11, and connects a source of the NMOS transistor NT1 to a ground terminal.

The inverter IV17 inverts the page address control signal page_add_ctrl. The NOR gate NOR12 performs a NOR operation on the page address detecting signal atdsumbp_page and output signals from the inverters IV12 and IV17. The inverter IV18 inverts an output signal from the NOR gate NOR12 to generate the page address precharge signal page_add_pcg.

The inverter IV19 inverts the refresh signal refb, and the delay unit 30 delays an output signal from the inverter IV19 for a predetermined time.

The NOR gate NOR13 performs a NOR operation on the chip selecting signal chip_select_b and an output signal from the delay unit 30. The inverter IV30 inverts an output signal from the NOR gate NOR13.

The NAND gate ND11 performs a NAND operation on output signals from the inverters IV18 and IV20. The NMOS transistor NT3 connects the source of the NMOS transistor NT1 the ground terminal in response to an output signal from the NAND gate ND11.

The delay unit 32 delays the write enable signal web for a predetermined time, and the delay unit 34 delays the chip selecting signal chip_select for a predetermined time.

The NAND gate ND12 performs a NAND operation on output signals from the delay units 32 and 34. The NMOS transistor NT4 connects the source of the NMOS transistor to the ground terminal in response to an output signal from the NAND gate ND12.

Figure 6:
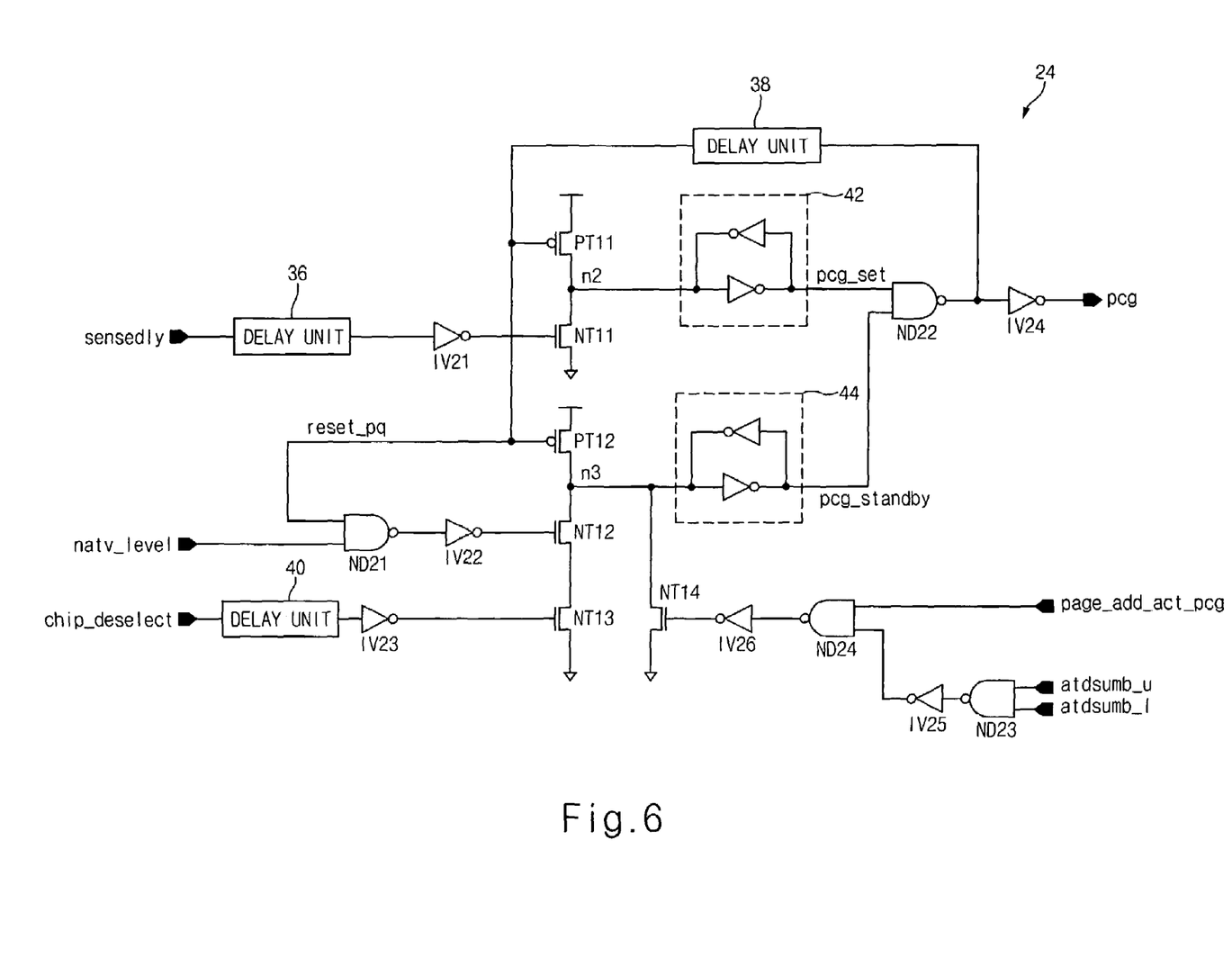
FIG. 6 is a circuit diagram illustrating a precharge unit of FIG. 3.

FIG. 6 is a circuit diagram illustrating a precharge unit 24 of FIG. 3.

The precharge unit 24 comprises inverters IV21~IV26, NAND gates ND21~ND24, PMOS transistors PT11~PT12, NMOS transistors NT11~NT14, delay units 36, 38 and 40, and latch units 42 and 44.

The delay unit 36 delays the sense detecting signal sensedly for a predetermined time, and the inverter IV21 inverts a signal outputted from the delay unit 36.

The PMOS transistor PT11 pulls up a node n2 to a power voltage in response to a reset signal reset_pq, and the NMOS transistor NT11 pulls down the node n2 to a ground voltage in response to an output signal from the inverter IV21. Here, the node n2 is a common drain of the PMOS transistor PT11 and the NMOS transistor NT11.

The latch unit 42 which maintains a potential of the node n2 generates a precharge set signal pcg_set.

The NAND gate ND21 performs a NAND operation on the reset signal reset_pq and a normal active level signal natv_level, and the inverter IV22 inverts an output signal from the NAND gate ND21.

The PMOS transistor PT12 pulls up a node n3 to the power voltage in response to the reset signal reset_pq, and the NMOS transistor NT12 pulls down the node n3 in response to an output signal from the inverter IV22. Here, the node n3 is a common drain of the PMOS transistor PT12 and the NMOS transistor NT12.

The latch unit 44 which maintains a potential of the node n3 generates a precharge standby signal pcg_standby.

The NAND gate ND22 performs a NAND operation on the precharge set signal pcg_set and the precharge standby signal pcg_standby, and the inverter IV24 inverts an output signal from the NaND gate ND22 to generate a precharge signal pcg.

The delay unit 38 delays an output signal from the NAND gate ND22 for a predetermined time to generate the reset signal reset_pq.

The delay unit 40 delays the chip non-selection signal chip_deselect for a predetermined time, and the inverter IV23 inverts an output signal from the delay unit 40.

The NMOS transistor NT13 connects a source of the NMOS transistor NT12 to a ground terminal in response to an output signal from the inverter IV23.

The NAND gate ND23 performs a NAND operation on the normal address transition detecting signals atdsumb_u and atdsumb_l. The inverter IV25 inverts an output signal from the NAND gate ND25.

The NAND gate ND24 performs a NAND operation on an output signal from the inverter IV25 and the page address precharge signal page_add_pcg, and the inverter IV26 inverts an output signal from the NAND gate ND24.

The NMOS transistor NT14 connects the node n3 to the ground terminal in response to an output signal from the inverter IV26.

Hereinafter, the operation of the page access control circuit of the semiconductor memory device is described.

Referring to FIG. 3, in address strobe control, the address buffer 12 is controlled by the page address control signal page_add_ctrl generated by the sense detecting signal sensedly in a page mode. That is, address information is transmitted through the address strobe signal add_stb into a pre-decoder when the sense detecting signal sensedly is 'low', and directly transmitted into the pre-decoder when the sense detecting signal sensedly is 'high'.

Referring to FIGS. 3 and 5, in active control, the page address active precharge identification signal page_add_act_pcg is generated which judges that a page address transition detecting signal atdsumb_page is an active signal by the page address control signal page_add_ctrl generated by the sense detecting signal sensedly. That is, the page address transition detecting signal atdsumb_page is judged as an active signal when the sense detecting signal sensedly is 'low', and not as an active signal when the sense detecting signal sensedly is 'high'.

Referring to FIGS. 3, 5 and 6, in precharge control, a precharge timing is determined by the page address active precharge identification signal page_add_act_pcg generated from the pre-active unit 22. That is, the page address transition detecting signal atdsumb_page controlled by the sense detecting signal sensedly determines the precharge timing. The precharge operation is performed when the sense detecting signal sensedly is 'low', and is not performed when the sense detecting signal sensedly is 'high'.

Referring to FIG. 3, in column control, the column control unit 16 performs a column operation for page access in response to the page address control signal page_add_ctrl. Here, the column selecting signal Yi is enabled by a normal path when the sense detecting signal sensedly is 'low'.

When the sense detecting signal sensedly is 'high', an enabling timing is determined by the write/read operation strobe signal wtdr_stb, so that the column selecting signal Yi si enabled.

Figure 7A:
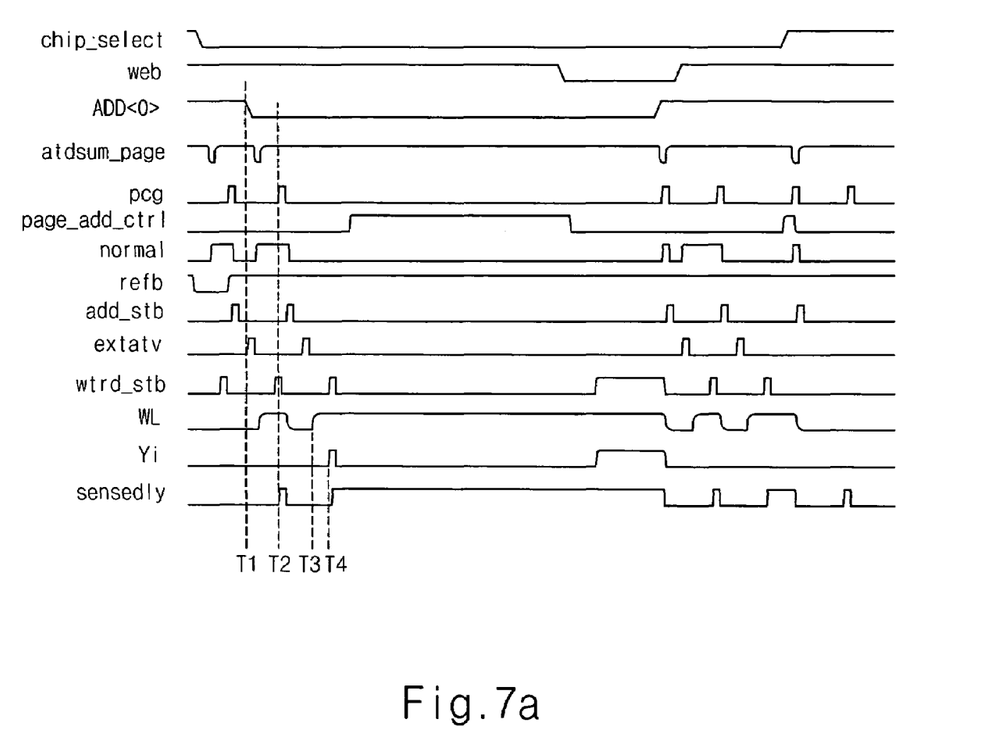
FIGS. 7a and 7b are simulation diagrams illustrating the page access control circuit of FIG. 3.
Figure 7B:
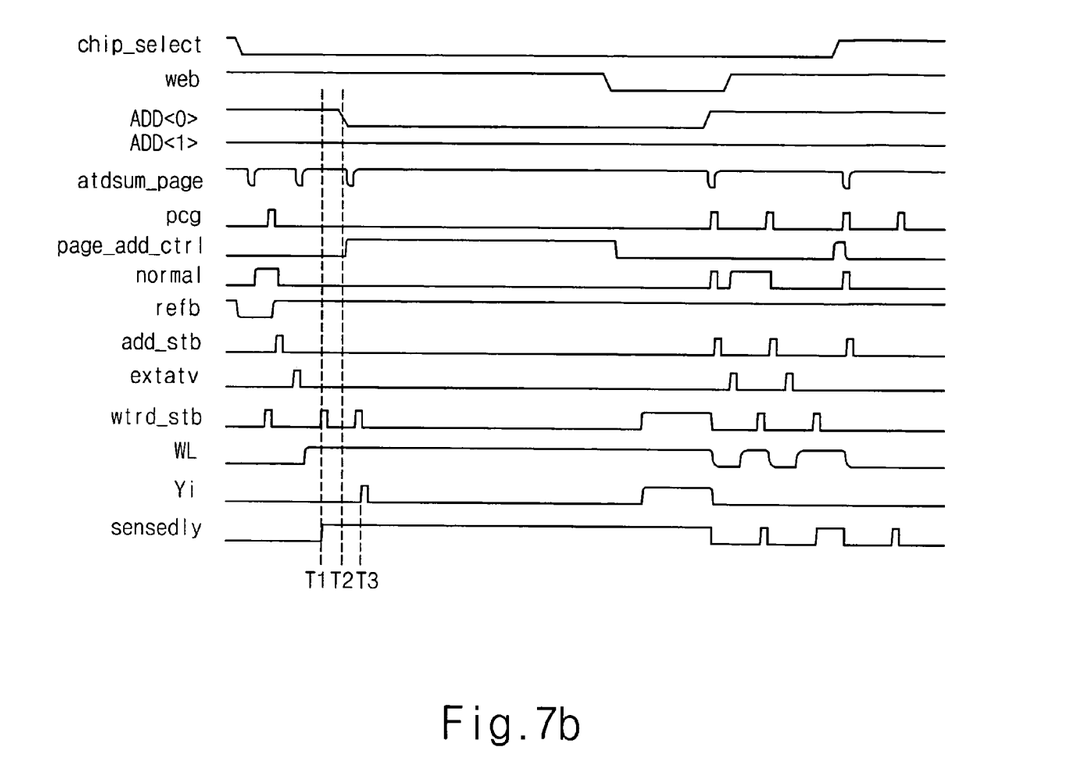

FIGS. 7a and 7b are simulation diagrams illustrating the page access control circuit of FIG. 3.

FIG. 7a is a timing diagram when a page address ADD<0> is earlier transited than the sense detecting signal sensedly.

At a read mode, when the page address ADD<0> is transited (T1) before the sense detecting signal sensedly is enabled to a high level (T2), this address toggle is regarded as a command signal pcg/act to access a new word line WL (T3). As a result, a new column selecting signal Yi is enabled (T4).

Meanwhile, FIG. 7b is a timing diagram when the page address ADD<0> is transited later than the sense detecting signal sensedly.

When the page address ADD<0> is transited after the sense detecting signal sensedly is enabled to the high level (T1), this address toggle is regarded as a column signal for page access, so that a new column access operation on the currently accessed word line is performed. That is, the currently accessed word line is maintained, and a new column selecting signal Yi is enabled (T3) As a result, the PSRAM which performs a page operation do not receive a page address as an address but recognizes the page address as a new active signal when the page address is inputted earlier than tRC. That is, a previous address is disabled, and a read operation is performed with a current address. Thus, two or more columns are selected to prevent destruction of data.

As described above, a page access control circuit of a semiconductor memory device according to an embodiment of the present invention prevents mis-operations due to normal access even when a page address toggles at any timing.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A page access control circuit of a semiconductor memory device, comprising:

an address transition detecting unit adapted and configured to generate a page address transition detecting signal;

a column control unit controlled by a page address control signal, and adapted and configured to generate a active operation strobe signal in response to the page address transition detecting signal;

a column selecting unit adapted and configured to generate a column selecting signal in response to the active operation strobe signal;

a page control unit controlled by a sense detecting signal which represents completion of an operation of a bit line sense amplifier, and adapted and configured to generates the page address control signal in response to a refresh signal and a read command signal;

a pre-active unit adapted and configured to generate a normal mode control signal which represents that there is a new external access, and to generate a mode identification signal in response to the page address control signal and the page address transition detecting signal; and a precharge unit controlled by the mode identification signal, and adapted and configured to perform a selective precharge operation.

2. The page access control circuit according to claim 1, wherein the precharge unit comprises a logic combination unit adapted and configured to logically combine the mode identification signal and normal address transition detecting signals.

3. The page access control circuit according to claim 2, wherein the precharge unit enables the precharge signal when the normal address transition detecting signals are enabled and the mode identification signal is enabled.

4. The page access control circuit according to claim 1, wherein the precharge unit comprises:

a first driving unit driven by the sense detecting signal;

a second driving unit driven by a chip selecting signal and a signal to detect an external access; and a logic combination unit for logically combining output signals from the first driving unit and the second driving unit.

5. The page access control circuit according to claim 1, wherein the pre-active unit comprises:

a first signal generating unit adapted and configured to generate the normal mode control signal in response to the address strobe signal; and a second signal generating unit adapted and configured to logically combine the page address transition detecting signal and the page address control signal and to generate the mode identification signal.

6. The page access control circuit according to claim 5, wherein the first signal generating unit comprises:

a first logic combination unit adapted and configured to logically combine the normal address transition detecting signals and the chip selecting signal;

a second logic combination unit adapted and configured to logically combine the chip selecting signal, the refresh signal and the mode identification signal;

a third logic combination unit adapted and configured to logically combine the write enable signal and the chip selecting signal; and a driving unit controlled by output signals from the first logic combination units through the third logic combination unit, and adapted and configured to be driven by the address strobe signal to generate the normal mode control signal.

7. The page access control circuit according to claim 6, wherein the second logic combination unit comprises a fourth logic combination unit adapted and configured to logically combine the chip selecting signal and the refresh signal.

8. The page access control circuit according to claim 6, wherein the second logic combination unit further comprises a delay unit adapted and configured to delay the refresh signal for a predetermined time.

9. The page access control circuit according to claim 6, wherein the third logic combination unit comprises:

a first delay unit adapted and configured to delay the write enable signal for a predetermined time; and a second delay unit adapted and configured to delay the chip selecting signal for a predetermined time.

10. The page access control circuit according to claim 1, wherein the page control unit comprises:

a fifth logic combination unit adapted and configured to logically combine the sense detecting signal, a refresh signal and a read command signal; and a third delay unit adapted and configured to delay an output signal from the fifth logic combination unit for a predetermined time.

11. The page access control circuit according to claim 10, wherein the fifth logic combination unit comprises a sixth logic combination unit adapted and configured to logically combine the refresh signal and the read command signal.

* * * * *